United States Patent [19]

Calabro

[11] 4,408,220

[45] Oct. 4, 1983

[54] HEAT DISSIPATOR FOR A DUAL IN LINE INTEGRATED CIRCUIT PACKAGE

[76] Inventor: Anthony D. Calabro, 8738 W. Chester Pike, Upper Darby, Pa. 19082

[21] Appl. No.: 229,449

[22] Filed: Jan. 29, 1981

[51] Int. Cl.$^3$ .................... H01L 23/02; H01L 23/48; H01L 29/44
[52] U.S. Cl. .................................. 357/81; 165/80 B; 174/16 HS; 357/68
[58] Field of Search ................. 357/81, 68; 165/80 B; 174/16 HS

[56] References Cited

U.S. PATENT DOCUMENTS

| | | | |
|---|---|---|---|
| 3,217,793 | 11/1965 | Coe ........................................ | 357/81 X |
| 3,249,680 | 5/1966 | Sheets et al. ........................ | 357/81 X |
| 3,378,736 | 4/1968 | Vale et al. ............................. | 357/81 |
| 3,465,212 | 9/1969 | Grimes et al. ........................ | 357/81 |
| 3,548,927 | 12/1970 | Spurling ................................ | 165/80 |
| 3,572,428 | 3/1971 | Monaco ................................ | 357/81 X |
| 4,203,488 | 5/1980 | Johnson et al. ..................... | 165/80 B |
| 4,215,361 | 7/1980 | McCarthy ............................. | 357/81 |
| 4,235,285 | 11/1980 | Johnson et al. ..................... | 165/80 B |
| 4,261,005 | 4/1981 | McCarthy ............................. | 357/81 |

FOREIGN PATENT DOCUMENTS

| | | |
|---|---|---|
| 726196 | 3/1955 | United Kingdom . |
| 946289 | 1/1964 | United Kingdom . |
| 1021173 | 3/1966 | United Kingdom . |
| 1361566 | 7/1974 | United Kingdom . |

*Primary Examiner*—Andrew J. James
*Assistant Examiner*—S. Nehrbass
*Attorney, Agent, or Firm*—Hedman, Casella, Gibson, Costigan and Hoare

[57] ABSTRACT

A heat dissipator for use with a dual in line integrated circuit package. The subject dissipator is unitary in construction and formed of a resilient material to facilitate rapid mounting and subsequent removal from an IC package. The dissipator includes a pair of opposed top and bottom contact plates interconnected by an intermediate segment. A radiator plate is provided extending upwardly from the remaining free end of the top contact plate. The dissipator may be slidably mounted on an IC package, with the bottom contact plate being in contact with the bottom wall of the package and with the top contact plate being in coplanar and contiguous relationship with the top wall of the package. By this arrangement, heat generated by the IC package during use is conducted by the top and bottom contact plates to the radiator plate for dissipating the heat and reducing the operating temperature of the package.

8 Claims, 7 Drawing Figures

HEAT DISSIPATOR FOR A DUAL IN LINE INTEGRATED CIRCUIT PACKAGE

BACKGROUND OF THE INVENTION

The subject invention relates to a heat dissipator used with dual in line integrated circuit packages. More specifically, a resilient, unitary heat dissipator is disclosed which may be readily mounted on an IC package for dissipating heat generated in the package while in operation.

The development of integrated circuits, wherein a plurality of interconnected circuits are contained in a single package, has enabled the miniaturization of a variety of devices. The configuration of the IC package has been generally standardized and consists of a longitudinally extending, rectangular housing having a number of flat leads extending downwardly from opposite sides of the package in two parallel rows. In the assembly of electrical devices, the leads of the IC package are connected to the electrical circuitry. In order to facilitate the replacement of the IC package, standardized IC sockets were developed which are soldered directly to the circuit, with the IC package being removably mounted in the socket.

In the operation of the device, heat is generated in the IC package which is proportional to the amount of current being driven therethrough. Since the IC packages are relatively small, and usually closely spaced on a printed circuit board, temperatures within the packages can increase 40°-50° centigrade, often causing problems to develop. For example, as the temperature of an IC package increases, its efficiency will decrease. More importantly, continuous high current levels driven through an IC package can result in the breakdown of the circuitry due to high internal temperatures.

Accordingly, in the prior art, a variety of heat dissipators or heat sinks have been developed for conducting and radiating the heat away from an IC package. One commonly used heat dissipator for use with IC packages consists of rectangular plate member having a plurality of upwardly extending radiating fins. The dimensions of the rectangular plate substantially conform to the dimensions of the top wall of the IC package and is adhesively connected thereto. By this arrangement, heat generated throughout the IC package is conducted through the plate, to the fins and radiated into the air.

While the latter heat sinks were capable of achieving some amount of temperature reduction, they have proved to be undesirable for a variety of reasons. For example, the requirement of adhesively connecting individual heat dissipators to each IC package is time consuming and expensive. Further, should it be desired to remove an IC package from the circuit, the replacement package must be provided with a new heat dissipator since the original dissipator cannot be reused. Another significant disadvantage of the top mounted heat sinks relates to the internal construction of a conventional IC package. More specifically, in a typical IC package, an integrated circuit chip is centrally located adjacent the bottom wall of the housing. Thus, in use, heat is initially generated adjacent the bottom wall. Accordingly, when utilizing the prior art dissipators, the heat must first travel through the housing towards the top wall by conduction, before it can be dissipated by a top mounted dissipator.

In order to overcome these shortcomings, various other prior art heat dissipators were developed. For example, a heat dissipator has been developed which includes separate top and bottom plate members. More specifically, a bottom plate member is provided which is fit around an IC socket prior to the mounting of the IC package. After the IC package is mounted over the bottom plate member, a top member is added and affixed to the bottom member. This prior art combination enables a portion of the heat generated by the integrated circuit chip to be conducted directly away from the bottom wall of the housing. The latter prior device however is undesirable in that it requires complex mounting and connection procedures. Further, to facilitate mounting and interconnection, flanges are provided which extend beyond the plan dimensions of the IC socket. The latter shortcoming is particularly undesirable where space requirements are critical, since additional distance must be provided between each IC socket to accommodate the projecting flanges.

Another example of a heat dissipator found in the prior art which enables a plurality of IC packages to be simultaneously cooled, includes a conductive metal plate member. More specifically, on a printed circuit board, wherein a plurality of IC packages are mounted in a planar array, a metal plate can be mounted such that the top wall of each housing is in contact therewith. By this arrangement, a single plate can conduct heat away from the tops of all the packages. The latter prior art dissipator obviates the necessity of adhesively connecting individual heat sinks to each IC package. However, as can be appreciated, the heat generated at the bottom of the package still must be conducted throughout the housing, to the top wall, before it can be removed by the plate.

Accordingly, it is an object of the subject invention to provide a new and improved heat dissipator for a dual in line integrated circuit package.

It is another object of the subject invention to provide a new and improved heat dissipator which may be slidably and removably mounted on an IC package.

It is a further object of the subject invention to provide a new and improved heat dissipator which is operative to directly remove the heat generated adjacent the bottom wall of the IC package housing.

It is still another object of the subject invention to provide a new and improved heat dissipator which is unitary in construction, and formed from a resilient material so that it may be easily mounted and removed for reuse.

It is still a further object of the subject invention to provide a new and improved heat dissipator which does not extend beyond the plan dimensions of a rectangular IC socket.

It is still another object of the subject invention to provide a new and improved heat dissipator which includes a means for inhibiting the relative movement between the dissipator and the IC package thereby preventing unwanted shifting due to vibration or other causes.

It is still a further object of the subject invention to provide a new and improved heat dissipator which may be used in combination with a heat dissipating plate to increase the amount of heat removed from the IC package.

SUMMARY OF THE INVENTION

In accordance with these and many other objects, the subject invention provides for a heat dissipator which is unitary in construction and is formed from a resilient material enabling it to be readily mounted or removed from an IC package. The subject heat dissipator includes a pair of opposed, longitudinally extending, spaced apart, top and bottom contact plates. An intermediate segment is provided extending between and connecting the plates. A radiator plate extends upwardly from the opposed remaining end of the top contact plate and operates as a radiating fin for dissipating heat. In use, the heat dissipator may be slidably mounted onto an IC package with the bottom contact plate making contact with the bottom wall of the package housing. The top contact plate is in coplanar and contiguous relationship with the top wall of the housing. In operation, heat generated in the IC package due to current flow is conducted to both the top and bottom contact plates. This heat is transmitted to the radiator plate and is dissipated in the air. The subject invention is thus capable of reducing the operating temperature of an integrated circuit package thereby maintaining efficiency and preventing breakdown.

In a preferred embodiment of the subject invention, the bottom contact plate is arcuate in configuration and includes an upwardly extending apex portion which contacts the bottom wall of the IC package at an intermediate point thereof. By this arrangement, the localized heat generated by the circuit chip, disposed adjacent the bottom wall of the housing is directly conducted to the heat dissipator and immediately away from the package. The subject heat dissipator is preferably provided with means to prevent the relative movement between the IC package and the dissipator. The means may include a pair of opposed rails, which extend downwardly from the side edges of the top contact plate. The rails are provided to engage the side edges of the top wall of the housing to inhibit the slippage of the heat dissipator from its desired mounting position. The subject heat dissipator may also be provided with a downwardly extending locking flange disposed at the connection between the top contact plate and the radiator plate. The locking flange is provided to further stabilize the heat dissipator and prevent its dislodgement due to vibration or other causes.

As will become apparent, the subject heat dissipator overcomes many of the shortcomings associated with prior art devices. More specifically, the subject heat dissipator is relatively low in cost due to its simple unitary construction. Further, since the heat dissipator is formed of a resilient material, its spring like qualities enable it to be readily mounted and subsequently removed from an IC package for reuse. Further, the plan dimensions of the subject invention substantially conform to the dimensions of an IC socket such that additional mounting area on a circuit board is not required. Another distinct advantage of the subject invention is that it may be readily adapted for use in combination with a prior art metal plate heat dissipator. More specifically, a metal plate heat dissipator may be mounted in conjunction with a circuit board having a plurality of IC packages thereon, each being provided with the subject heat dissipator. In the later arrangement, the upper surface of each of the radiator plates of the subject heat dissipators are in contact with the metal plate such that heat is conducted away from IC packages by both radiation and conduction. By this arrangement, maximum cooling of the IC packages can be achieved.

These and other objects of the subject invention will become apparent from the detailed description taken in conjunction with the following drawings in which:

DESCRIPTION OF THE PREFERRED EMBODIMENT

Figure 1:
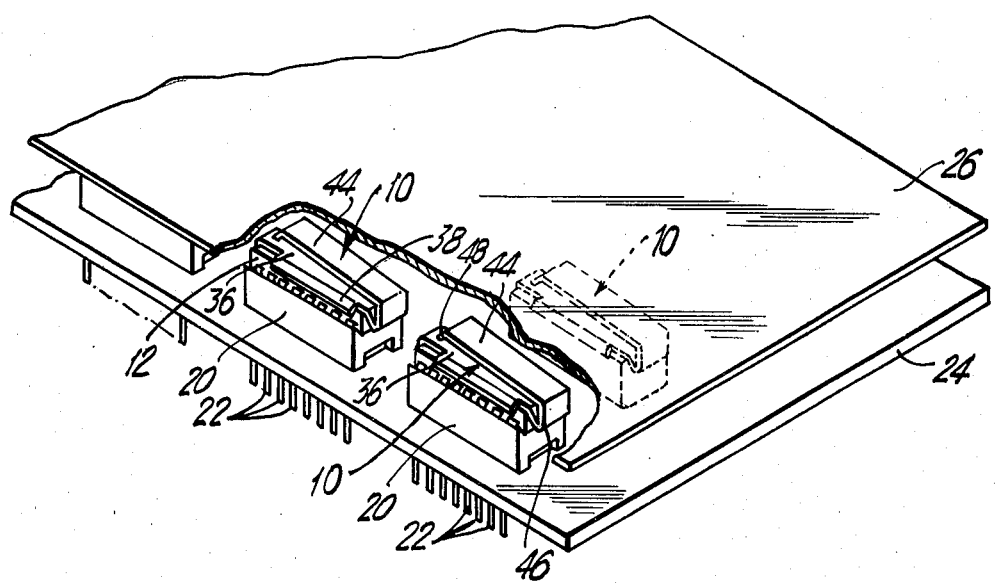
FIG. 1 is a perspective view of the new and improved heat dissipator of the subject invention as used in conjunction with IC packages mounted on a printed circuit board, in combination with a metal heat dissipator, the latter shown partially cut away for clarity.
Figure 2:
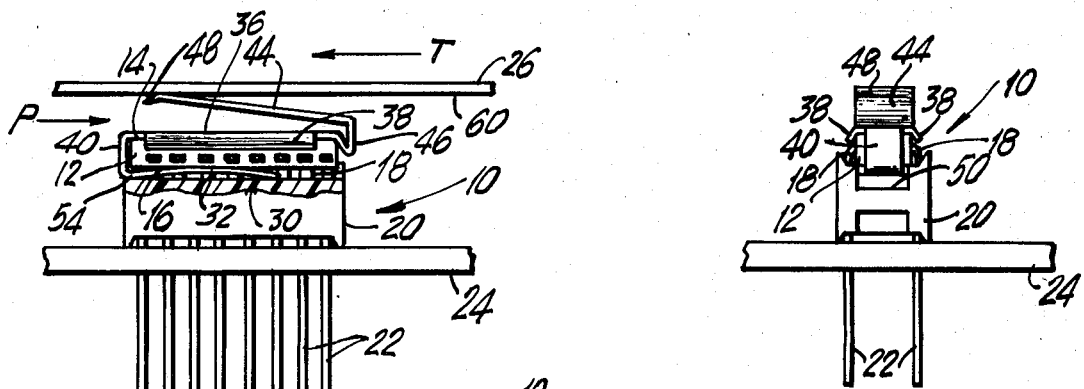
FIG. 2 is a partial side view of the combination illustrated in FIG. 1 including the new and improved heat dissipator of the subject invention.
Figure 3:
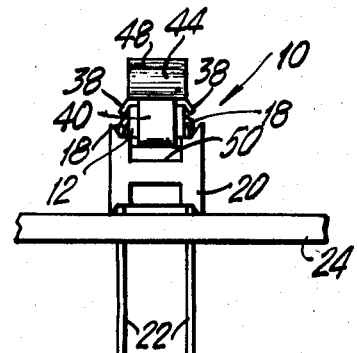
FIG. 3 is a left end view of the new and improved heat dissipator of the subject invention, shown mounted on an IC package, similar to FIG. 2.

Referring to FIGS. 1-3, there is illustrated the new and improved heat dissipator 10 of the subject invention for use with a standard, dual in line integrated circuit package 12. A conventional IC package 12 is generally rectangular in configuration having opposed top and bottom walls 14 and 16. The package 12 includes a plurality of flat leads 18 extending downwardly from opposed sides of the package in two parallel rows. The number of leads and the length of the housing are dependent on the particular type of IC package. However, the height and width of the housing are standardized throughout the industry for all IC packages. Accordingly, the stated dimensions of the subject heat dissipator 10, which relate to height and width, are constant for all IC packages. In contrast, the preferred length measurements are stated for use with a standard 16 pin IC package and can be varied accordingly.

As illustrated in FIGS. 1-3, the IC package 12 is generally mounted on a conventional IC socket 20 having a plurality of pin receiving apertures (not shown) for receiving the leads 18 of the IC package. The IC socket 20 is shown mounted, via leads 22, to a conventional printed circuit board 24. As discussed more fully hereinafter, the subject invention may be used in combination with a metal plate heat dissipator 26 to enhance the temperature reducing effects of the subject invention.

Figure 4:
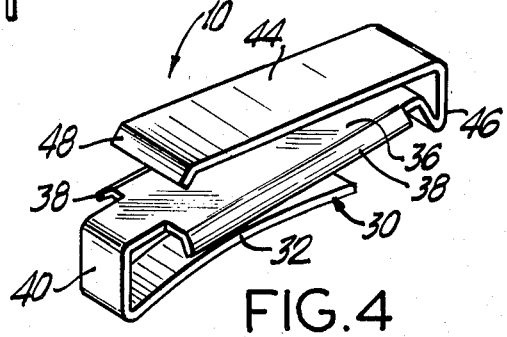
FIG. 4 is a perspective view of the new and improved heat dissipator of the subject invention.
Figure 5:
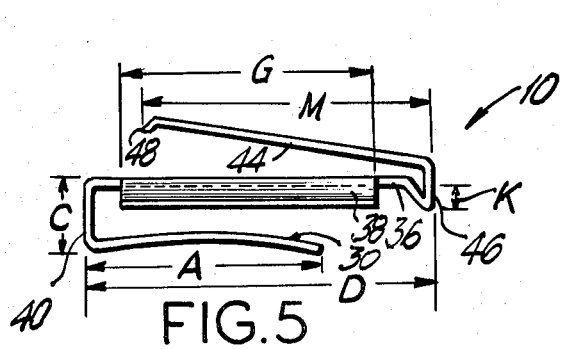
FIG. 5 is a side view of the new and improved heat dissipator of the subject invention.
Figure 6:
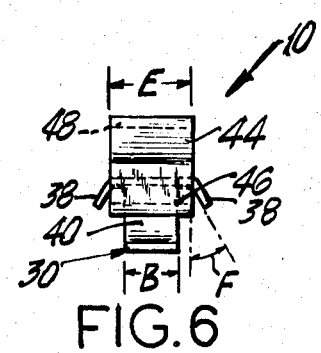
FIG. 6 is a right end view of the new and improved heat dissipator of the subject invention.

Referring now to FIGS. 4-6, the heat dissipator 10 of the subject invention is more particularly illustrated and includes a longitudinally extending bottom contact plate 30 which is preferably arcuate or bow-like in configuration. The arcuate configuration of the bottom contact plate defines an upwardly extending apex portion 32, which is capable of establishing a localized contact with the bottom wall 16 of the IC package, as more fully described hereinafter. A generally planar top contact plate 36 is disposed in spaced relationship to the bottom contact plate 30. Top contact plate 36 is provided with a pair of opposed downwardly extending rails 38 for stabilizing the dissipator 10 on the IC package 12. An intermediate segment 40 bridges a pair of adjacent ends of the top and bottom contact plates 36 and 30 respectively. A radiator plate 44 extends upwardly from the opposed free end of the top contact plate 36. Preferably, a locking flange 46 is provided interconnecting the top contact plate 36 and radiator plate 44. The downwardly extending locking flange 46 provides added stability and prevents the inadvertent shifting of the dissipator 10 due to vibrations or other causes. The opposed end of radiator plate 44 is preferably provided with a downwardly turned lip 48 to reduce the likelihood of interference with a cooperating metal heat dissipating plate 26.

The subject heat dissipator 10 is unitary in construction and is formed from a material which is both resilient and heat conductive. Examples of materials used for forming the subject dissipator 10 include copper or phosphor bronze. The resilient properties of the forming material enables the dissipator to be slidably mounted on an IC package without difficulty. Further, should it be necessary to replace a particular IC package the subject dissipator 10 can be readily removed and reused with the replaced IC package.

The dimensions of the subject dissipator 10 are adjusted to provide maximum heat dissipation, to facilitate mounting and to reduce the likelihood of dislodgement from the IC package. Preferably, the bottom contact plate 10 is provided with a length permitting it to extend at least half the length of the IC package 12. As discussed above, the length will vary depending on the IC package used, however, with a standard 16 pin package, bottom plate should extend a length A, on the order of 0.625 inches. The width B of the bottom plate 30 must be sufficiently narrow so as not to interfere or make electrical contact with the downwardly extending leads 18 of the IC package 12. Preferably, width B is equal to approximately 0.20 of an inch. Intermediate segment 40 is provided with a length C on the order of 0.140 inches which substantially conforms to the height of the IC package. The length D of the top contact plate 36 is adjusted to substantially conform to the length of the housing of the IC package 12 and is preferably on the order of 0.845 inches. To provide stability and maximize the contact area, the width E of the top contact plate 36 should substantially conform to the width of the housing of the IC package and is on the order of 0.25 inches. Preferably, the width is no greater than the width of the IC package such that the dissipator does not project beyond plan dimensions of the IC socket.

As mentioned above, in the preferred embodiment of the subject invention, in order to stabilize the position of the dissipator 10 on the IC package, a pair of downwardly extending rails 38 are provided. The rails 38 are disposed at an angle F from the vertical, a maximum of 30°. As illustrated in FIG. 3, the downwardly extending rails 38 function to grip the side edges of the top wall 14 of the IC package to inhibit the lateral shifting of the dissipator 10. When the dissipator is used in conjunction with a conventional 16 pin IC package, the length G of the rails is on the order of 0.700 inches.

In the preferred embodiment of the subject invention, a second means is provided to further stabilize the dissipator. The second means includes a downwardly extending locking flange 46 defined by a V-shaped bend, interconnecting the top and radiator plates 36 and 44. Preferably, locking flange 46 extends below the plane of the top contact plate, a distance K on the order of 0.060 inches. Radiator plate 44 extends upwardly away from locking flange 46 a horizontal distance M which should be a minimum of 0.750 inches. The width of radiator plate 44 is substantially equal to the width of the top contact plate 36. The opposed free end of the radiator plate 44 is provided with a downwardly extending lip 48. As discussed more fully hereinbelow, the subject dissipator 10 may readily be used in combination with a metal plate dissipator 26. In such an arrangement, the metal plate dissipator 26 is usually slidably mounted into contact with the subject dissipators 10. Accordingly, downwardly extending lip 48 is provided to prevent any interference during the installation of the metal plate. Interference could result in the gouging of the metal plate or the dislodging of the dissipator 10 from the IC package.

Referring back to FIGS. 1–3, the use of the dissipator 10 of the subject invention is illustrated in conjunction with a conventional IC package 12. Typically, a circuit board 24 is constructed with printed circuits thereon and having a plurality of IC sockets 20 mounted and soldered thereto. Thereafter, the IC package 12 containing integrated circuit components, are mounted in the IC sockets 20. As discussed above, when current is passed through the integrated circuit, the IC chip located adjacent the bottom wall 16 of the IC package generates a considerable amount of heat.

In order to dissipate this heat, to maintain efficiency and prevent circuit failure, the heat dissipator 10 of the subject invention is slidably mounted on the IC package. More specifically, the dissipator 10 may be installed, around the IC package, in the direction indicated by arrow P in FIG. 2, such that the bottom contact plate 30 extends intermediate between the bottom wall 16 of the IC package and the top surface 50 of the IC socket 20. The width B of the lower contact member enables it to readily pass between the opposed, parallel rows of leads 18 without interference. It is intended that the bottom contact plate 30 be in frictional contact with the bottom wall 16 of the IC package. In the preferred embodiment of the subject invention, the bottom plate 30 is arcuate in configuration such that the upwardly extending apex portion 32 makes localized contact with the central area of the bottom wall 16 of the IC package. Since this central area is in close proximity to the IC chip, the heat generated thereby may be efficiently withdrawn by conduction. Further, due to the arcuate configuration of the bottom contact plate 30, the end 54 thereof, adjacent the intermediate element 40 (as seen in FIG. 2) is actually spaced from the bottom wall 16 of the IC package such that the most intense heat generated by the chip is immediately conducted or radiated away from the bottom wall of the housing.

During the mounting of the dissipator 10, the top contact plate 36 is aligned and disposed in coplanar and contiguous relationship with the top wall 14 of the IC package. By this arrangement, maximum conduction from the top wall to the dissipator is achieved. As illustrated in FIG. 3, the rails 38 function to stabilize the dissipator and prevent it from shifting due to vibrations. In addition, and as illustrated in FIG. 2, after the dissipator 10 is installed, the downwardly projecting locking flange 46 abuts the end of the IC package 12 further stabilizing the dissipator.

As can be appreciated, heat which is generated by the IC package during use is conducted throughout the unitary dissipator to the upwardly extending radiator 44. The heat is dissipated from the radiator into the air thereby reducing the temperature of the IC package. The cooling effects achieved by the dissipator 10 of the subject invention are graphically illustrated in FIG. 7 where the vertical axis measures the temperature rise in the IC package, in degrees centigrade, as the wattage through the IC package is increased. Tested at an ambient temperature of 22° centigrade, curve R corresponds to the temperature rise in an IC package which has not been provided with any cooling means. It will be observed that at one watt of power input, the temperature rise in the IC package is only about 12° C. However, when two watts of power are driven through the IC package, a temperature rise of 44° C. is experienced. In contrast, curve S represents the rise in temperature of an IC package having a heat dissipator 10 of the subject invention mounted thereon. At one watt of power, temperature rise is again small, on the order of 10° C. However, at 2 watts, it will be observed that only a 30° temperature rise occurs, demonstrating about a 32 percent reduction in temperature rise achieved using the heat dissipator 10 of the subject invention. This 32 percent reduction in temperature enables the IC package to be driven at higher currents for longer time periods without experiencing debilitating efficiency losses or breakdowns as could occur in a nonprotected device.

Another advantage to the heat dissipator 10 of the subject invention is that it can be readily used in combination with a heat dissipator plate 26 to further enhance temperature reductions. Referring again to FIGS. 1 and 2, it will be seen that a generally rectangular heat dissipator plate 26 can be mounted in spaced, parallel relationship to the printed circuit board 24 in any manner known in the prior art. It is intended that the plate 26 be slidably installed in a direction indicated by arrow T in FIG. 2 to prevent interference with the dissipator 10. The spacing between the plate 26 and the printed circuit board is such that contact is established between the lower surface 60 of plate 26 and the upper surface of the radiator plate 44. Preferably, the spacing should be adjusted such that maximum contact is achieved, with radiator 44 being substantially coplanar and contiguous with the plate 26. Use of the plate 26 is particularly desirable in situations where a plurality of integrated circuits are mounted on a single printed circuit board 24 making the combination economical.

Figure 7:
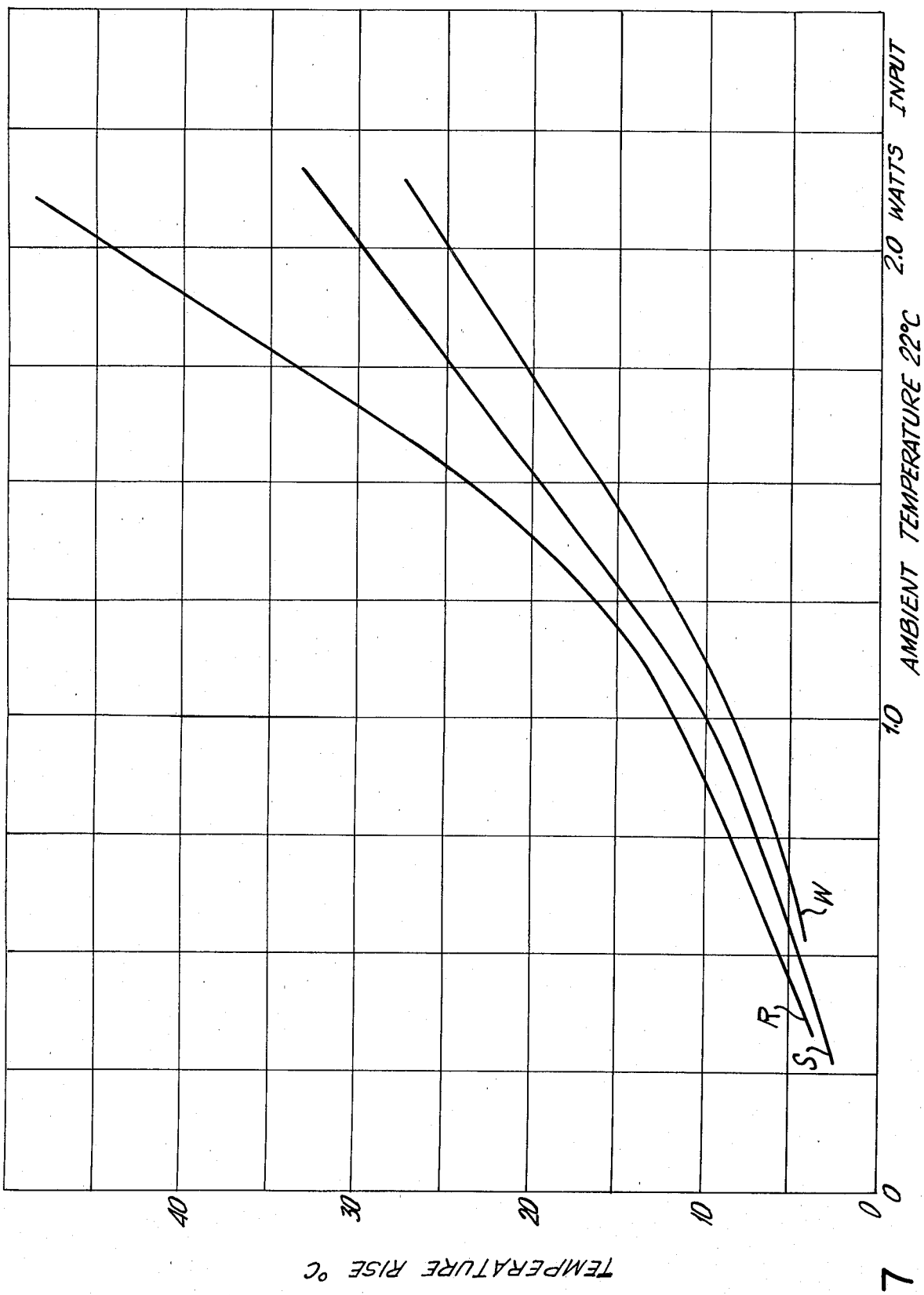
FIG. 7 is a graph illustrating the reduction in temperatures obtainable when using the new and improved heat dissipator of the subject invention.

The added benefits of utilizing a heat dissipating plate 26 in conjunction with the heat dissipator 10 of the subject invention is graphically illustrated in FIG. 7. Curve W represents the temperature rise in an IC package supplied with the latter combination. It will be observed that at two watts of power, a temperature rise of only 25° occurs which represents a 43 percent reduction as compared to an unprotected IC package represented by curve S.

Accordingly, there has been disclosed a new and improved dissipator for use with dual in line integrated circuit packages. The heat dissipator 10 is unitary in construction and formed from a resilient material to facilitate rapid installation and subsequent removal. The heat dissipator includes a pair of opposed longitudinally extending top and bottom contact plates 36 and 30 interconnected by an intermediate segment 40. A radiator plate 44 is provided extending from the opposed remaining end of the top contact plate. The heat dissipator can be slidably mounted on an integrated circuit package with the bottom contact plate in contact with the bottom wall of the IC package and the top contact plate being coplanar and contiguous with the top wall of the package. By this arrangement, heat generated by the integrated circuit package during use is conducted by the top and bottom contact plates to the radiator plate for dissipating the heat and reducing the operating temperatures of the package. In the preferred embodiment of the subject invention, the bottom contact plate is arcuate in configuration and makes localized contact with the intermediate area of the bottom wall of the package, adjacent the heat producing IC chip. Further, means are provided for stabilizing the dissipator on the IC package. More specifically, the means includes a pair of downwardly extending, angled rails 38 for engaging the side edges of the top wall of the IC package. Further, a downwardly extending locking flange 46 can be provided, interconnecting the top contact plate and the radiator plate for additionally stabilizing the assembly. The effects of the subject dissipator can be enhanced when used in combination with a metal plate dissipator.

While the subject invention has been described with reference to a preferred embodiment, it is apparent that further changes and modifications could be made therein, by one skilled in the art without varying from the scope and spirit of the invention as defined by the appended claims.

What is claimed is:

1. A heat dissipator for a dual in line integrated circuit package, said package having a longitudinally extending, generally rectangular housing with opposed top and bottom walls, opposed pairs of side and end walls, and a plurality of downwardly extending leads disposed in two longitudinally extending rows adjacent said side walls, said heat dissipator comprising:

a longitudinally extending bottom contact plate, the width of said bottom contact plate being less than the distance between said rows of leads;

a longitudinally extending top contact plate disposed in spaced relationship to said bottom contact plate, the width of said top contact plate substantially equalling the width of said integrated circuit package, said top contact plate including a pair of longitudinally aligned rails extending angularly downward from the side edges thereof;

an intermediate segment extending between and connecting one end of each of said contact plates; and a radiator plate extending from the opposed remaining end of said top contact plate, and a downwardly projecting locking flange being interconnected between said top contact and radiator plates, said heat dissipator being unitary in construction, and formed from a resilient material whereby said heat dissipator can be slidably mounted on said integrated circuit package with said bottom contact plate being in contact with said bottom wall intermediate said rows of leads, and with said top contact plate being in coplanar and contiguous relationship with said top wall, with the rails thereof gripping the side edges of said top wall and the downwardly projecting locking flange engaging one end of said integrated circuit package, the rails and the locking flange stabilizing said heat dissipator on said integrated circuit package, such that the heat generated by said integrated circuit package during use is conducted by said top and bottom contact plates to said radiator plate for dissipating said heat and reducing the operating temperature of said integrated circuit package.

2. A heat dissipator as recited in claim 1 wherein said bottom contact plate is generally arcuate in configuration and includes an upwardly extending apex whereby when said dissipator is mounted on said integrated circuit package, said apex portion is in localized contact with said bottom wall thereof.

3. A heat dissipator as recited in claim 1 wherein said downwardly extending rails are disposed at an angle from the vertical a maximum of 30°.

4. A heat dissipator as recited in claim 1 wherein said locking flange is V-shaped in configuration.

5. A heat dissipator as recited in claim 4 wherein said locking flange projects below the plane of said top contact plate a distance on the order of 0.060 inches.

6. A heat dissipator as recited in claim 1 wherein the length of said intermediate segment substantially conforms to the height of said integrated circuit package housing.

7. A heat dissipator as recited in claim 1 wherein the opposed remaining end of said radiator plate includes a downwardly projecting lip.

8. A heat dissipator as recited in claim 1 in combination with a planar heat conducting plate, said plate being disposed in contact with said radiator plate for enhancing the dissipation of heat from said integrated circuit package.

* * * * *